United States Patent [19]

Nesbit et al.

[11] Patent Number: 4,971,320

[45] Date of Patent: Nov. 20, 1990

[54] TENNIS RACKET EQUIPPED WITH A PORTABLE RADIO

[76] Inventors: Charles E. Nesbit, 9206 Willard Ct., Des Moines, Iowa 50322; Mark S. Nesbit, 1248 17th, West Des Moines, Iowa 50265

[21] Appl. No.: 331,828

[22] Filed: Apr. 3, 1989

[51] Int. Cl.[5] ..................... A63B 49/08; H05K 11/00; H04B 1/08
[52] U.S. Cl. .............................. 273/73 G; 273/73 R; 273/73 J; 455/344; 455/348; 455/347; 455/351
[58] Field of Search ................. 273/73 R, 73 G, 73 J, 273/29 A; 455/344, 347, 348, 351

[56] References Cited

U.S. PATENT DOCUMENTS

| | | | |
|---|---|---|---|
| 2,927,995 | 3/1960 | Francis | 455/344 |
| 4,101,132 | 7/1978 | Conrey | 273/73 R |
| 4,257,594 | 3/1981 | Conrey | 273/29 A |
| 4,535,986 | 8/1985 | Richards | 273/73 J |

*Primary Examiner*—Benjamin Layno
*Attorney, Agent, or Firm*—Henderson & Sturm

[57] ABSTRACT

A tennis racket equipped with a portable radio. The tennis racket frame has an open throat area. The housing of the portable radio is shaped for insertion within the open throat area. Bracket mounts and adjustable straps attached to the portable radio are used to secure the portable radio to tennis racket frame. The attachment of the radio to the tennis racket readily provides listening pleasure to the tennis player while he/she plays tennis.

3 Claims, 3 Drawing Sheets

TENNIS RACKET EQUIPPED WITH A PORTABLE RADIO

Technical Field

This invention relates to tennis rackets, and more particularly to tennis rackets housing an audio signal source with speaker assemblies secured in the throat area of the racket.

Background Art

There are many prior art devices related to the development of tennis rackets. There are also many prior art devices related to portable radio's. One problem associated with the prior art devices relating to tennis rackets is that since the game of tennis requires much body movement on the part of the player, the use of a personal portable radio mounted somewhere on the player would cause them some difficulties. Also if a tennis player were to try and use personal headphones as a source of audio enjoyment, communication between the other tennis player or players would be hampered. A problem associated with portable audio devices that are placed outside of the tennis court boundries concerns the fact that to be able to listen to the audio device the volume would have to be increased in order to reach the tennis player and thus by having the audio volume at this increased level the audio device would no longer be considered a personal audio device since the increased volume would affect others playing tennis on the same court or adjacent courts.

Those concerned with these and other problems recognize the need for an improved tennis racket with the speaker assembly contained in the throat of the tennis racket and the audio signal source attached in the shaft of the tennis racket.

Disclosure of the Invention

The present invention provides a tennis racket with a speaker or plurality of speakers attached in the throat area of a tennis racket. An audio signal source is housed inside the handle of the tennis racket and is electronically coupled to the speaker assemblies by wires that are run through the interior of the tennis racket.

An object of the present invention is the provision of an improved tennis racket for listening to an audio signal source.

Another object is to provide a tennis racket for listening to an audio signal source that leaves your hands free to hold the tennis racket.

A further object of the invention is the provision of a tennis racket that is easy to tune with just one hand, leaving the other hand free to hold the tennis racket.

Still another object is to provide a tennis racket for listening to an audio signal source that houses the speaker assemblies on the tennis racket.

A still further object of the present invention is to provide a tennis racket that houses an audio signal source that is extremely personal and portable.

Yet another embodiment of the present invention would be a portable separate audio signal source electronically coupled to a speaker assembly that would be interchangeable and fit into the open throat area of tennis rackets.

Yet still another object of the present invention is the provision of an tennis racket for listening to an audio signal source that is easy to use, inexpensive to manufacture, and has a pleasing eye appeal.

Brief Description of the Drawings

These and other attributes of the invention will become more clear upon a thorough study of the following description of the best mode for carrying out the invention, particularly when reviewed in conjunction with the drawings, wherein.

Best Mode for Carrying Out the Invention

Figure 1:
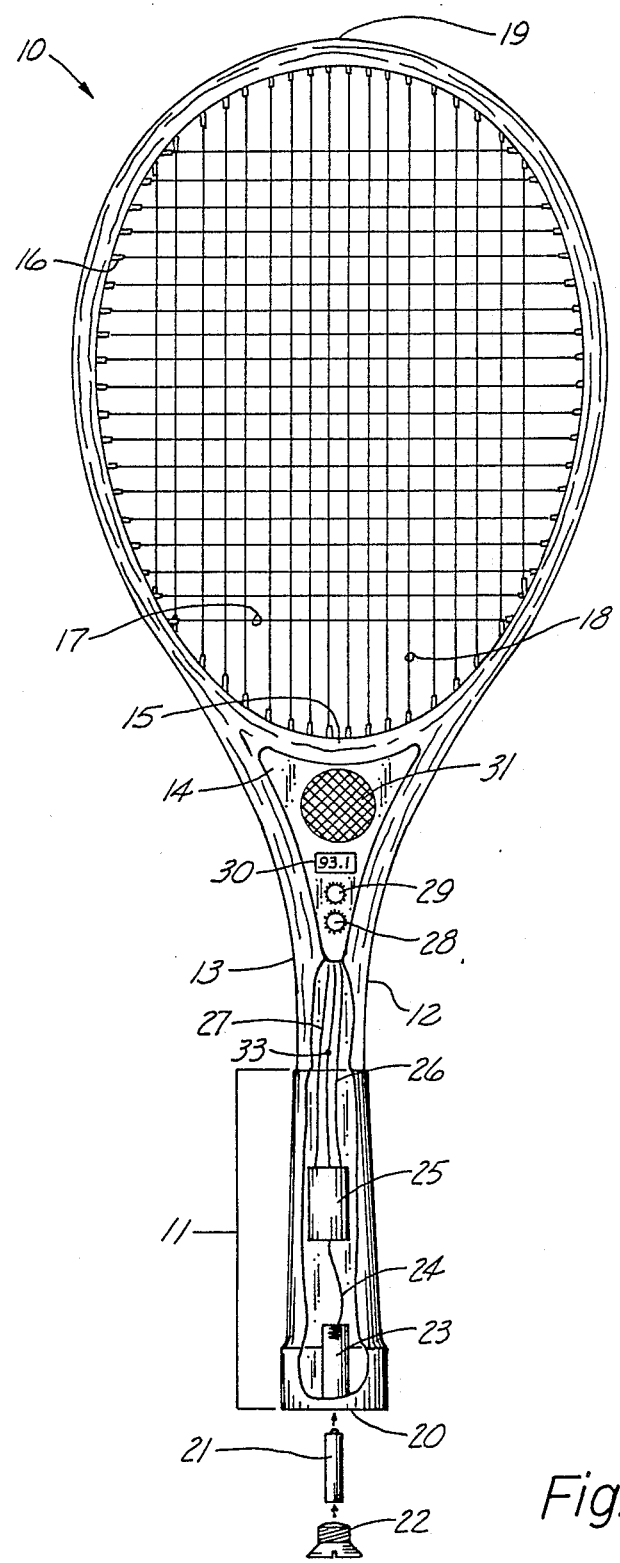
FIG. 1 is a full on perspective view of the tennis racket of the present invention.

Referring now to the drawings, wherein like reference numerals designate identical or corresponding parts throughout the several views. FIG. 1 shows the tennis racket generally at 10. The tennis racket (10) comprises a handle (11) a top cap (12) a shaft (13,: the built-in throat area audio mounting system (14) the throat bridge (15) the grommet system (16) cross strings (17) main strings (18) the tip (19) the heel battery access opening (20) the battery (21) the battery access screw in cover (22) the battery compartment (23) internal wiring (24) which connects to the audio signal source (25) the audio internal wiring which connects to the on/off volume control (26) the audio internal wiring that connects to the station tuning control (27) the volume control on/off knob (28) the station tuning knob (29) the radio station viewing window (30) the attached speaker assembly (31) which connects to the audio signal source (25)' by internal speaker wiring (33).

Figure 2:
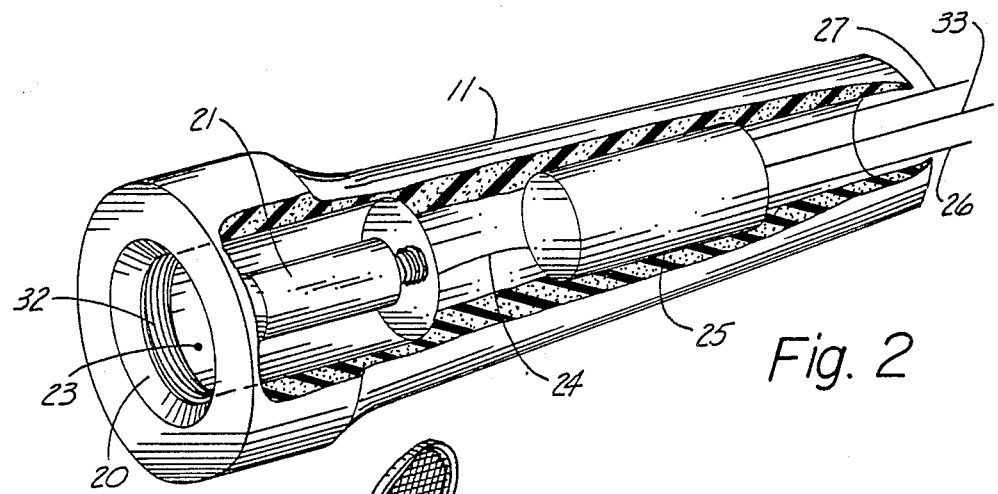
FIG. 2 is a cutaway view of the tennis racket handle showing the audio signal source integrally formed therein, showing the battery compartment in the bottom end of the handle grip, and having a portion cutaway showing the speaker wire.
Figure 2:
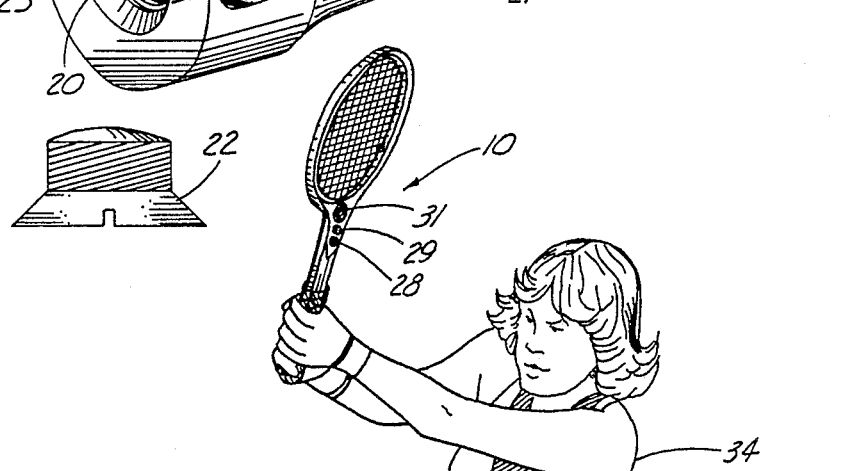

FIG. 2 The tennis racket handle (11) has an access opening (20) which leads to the battery compartment (23) the battery access screw-in cover (22) screws into threads (32) which closes the battery access opening (20) the battery (21) electronically connects by internal wiring (24) to the audio signal source (25) the audio on/off volume internal wiring (26) and the audio internal wiring for station tuning (27) along with the internal speaker wiring (33) are shown.

Figure 3:
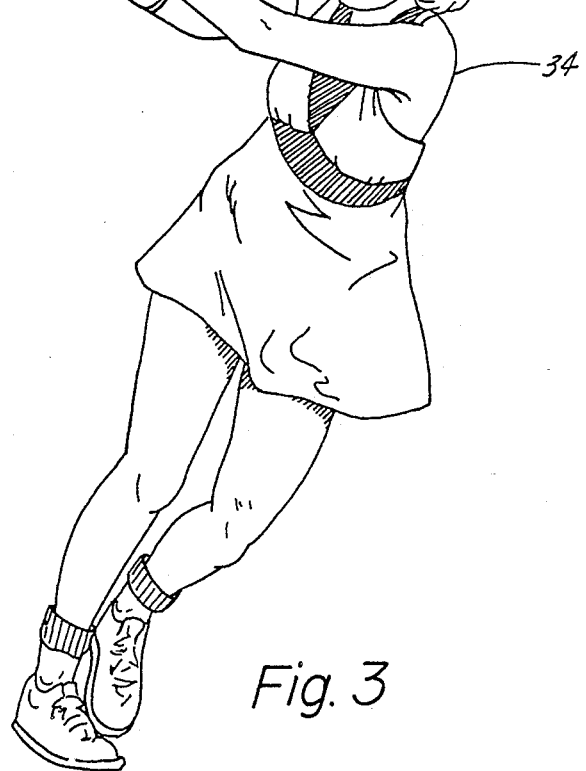
FIG. 3 is a perspective view of the audio tennis racket being used in a tennis match.

FIG. 3 depicts a tennis player (34) using the radio equipped tennis racket shown at (10) the speaker assembly on/off control knob (28) and the station tuning knob (29).

Figure 4:
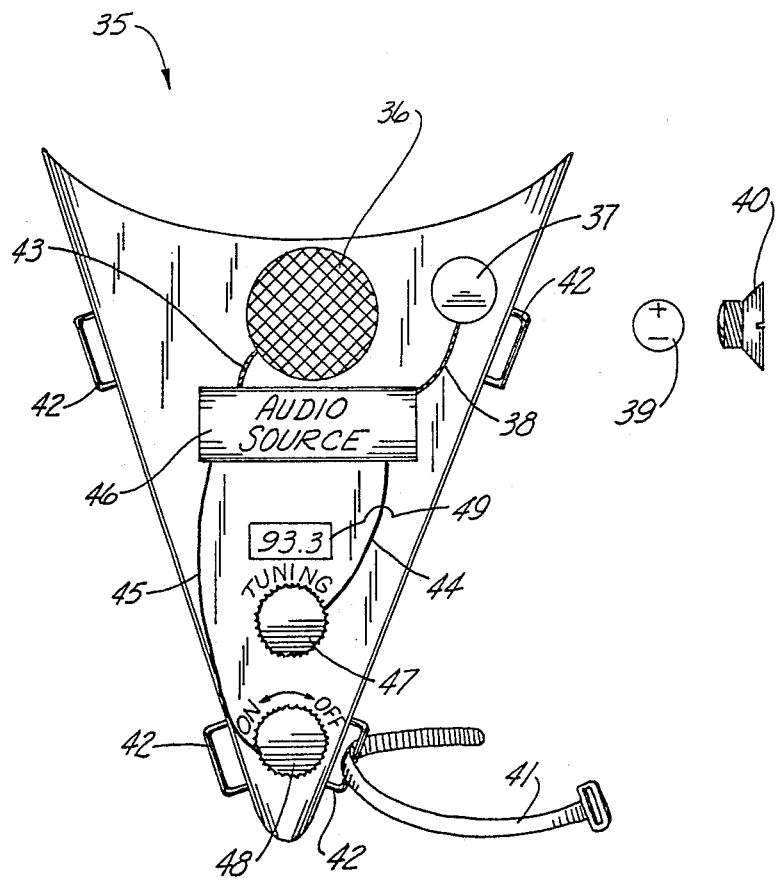
FIG. 4 is a perspective view of another embodiment of the present invention which would attach by fasteners into the open throat area of the tennis racket.

FIG. 4 is an alternate embodiment of the invention shown at (35) the speaker assembly (36) electronically connects by means of internal wiring (43) to the audio signal source (46). The audio signal source (46) is supplied by power from a battery (39) the battery (39) is housed inside a battery compartment (37), the battery compartment cover (40) encloses the power supply. The power supply wiring (38) connects to the audio signal source (46) the on/off volume knob (48) connects by internal wiring (44) to the audio signal source (46). A station viewing window (49) is located on the unit. Attachment bracket mounts (42) are formed to the unit, and adjustable straps (41) would be used to secure the unit to a tennis racket frame.

We claim:

1. In a sports racket frame comprising a handle, a shaft, a racket head and an open throat area formed between the shaft and the racket head an improvement comprising:

an audio signal source for generating verbal and musical sounds including at least one speaker assembly; tuning and volume controls operatively associated with the audio signal source; means for electrically coupling said at least one speaker assembly to said audio signal source;

a housing dimensioned to contain all of the components associated with said audio signal source and further dimensioned to be releasably received in said open throat area in the sports racket; and, means for temporarily and releasably retaining said housing within the said open throat area in the sports racket frame.

2. The improvement as in claim 1; wherein said means for temporarily and releasably retaining said housing within said open throat area comprise:

straps operatively attached to the said housing and dimensioned to secure the housing to the sports racket frame in the vicinity of the said open throat area.

3. The improvement as in claim 2; wherein said housing is further provided with brackets which are dimensioned to receive the straps for releasably securing the housing to the sports racket frame in the vicinity of the said open throat area.

* * * * *